US008704507B2

(12) United States Patent
Oksman et al.

(10) Patent No.: US 8,704,507 B2

(45) Date of Patent: Apr. 22, 2014

(54) METHOD FOR DETERMINING USAGE RATE OF BREAKING HAMMER, BREAKING HAMMER, AND MEASURING DEVICE

(75) Inventors: Mika Oksman, Hollola (FI); Ilkka Lehmusvirta, Järvenpää (FI)

(73) Assignee: Sandvik Mining and Construction Oy, Tampere (FI)

( * ) Notice: Subject to any disclaimer, the term of this patent is extended or adjusted under 35 U.S.C. 154(b) by 124 days.

(21) Appl. No.: 13/510,648

(22) PCT Filed: Dec. 20, 2010

(86) PCT No.: PCT/FI2010/051061

§ 371 (c)(1), (2), (4) Date: May 18, 2012

(87) PCT Pub. No.: WO2011/077001

PCT Pub. Date: Jun. 30, 2011

(65) Prior Publication Data

US 2012/0250815 A1 Oct. 4, 2012

(30) Foreign Application Priority Data

Dec. 21, 2009 (FI) ..................................... 20096374

(51) Int. Cl.
*G01R 19/00* (2006.01)
*G01N 3/34* (2006.01)
*E21B 1/00* (2006.01)

(52) U.S. Cl.
USPC .......................... 324/76.11; 73/11.03; 173/90

(58) Field of Classification Search
USPC ................ 324/76.11; 73/11.03, 11.02, 11.01, 73/12.07; 173/90
See application file for complete search history.

(56) References Cited

U.S. PATENT DOCUMENTS 5,978,749 A * 11/1999 Likins et al. .................. 702/158
6,170,317 B1 1/2001 Juuri et al.

(Continued)

FOREIGN PATENT DOCUMENTS

| | | |
|---|---|---|
| CN | 201242501 | 5/2009 |
| EP | 1 580 440 | 9/2005 |
| GB | 2 442 629 | 4/2008 |
| JP | 4-52992 | 2/1992 |
| WO | 03/033216 | 4/2003 |

OTHER PUBLICATIONS

International Search Report for PCT/FI2010/051061 dated Mar. 25, 2011.
Search Report and Office Action for Finnish Application No. 20096374 dated May 20, 2010.

*Primary Examiner* — Hoai-An D Nguyen

(74) *Attorney, Agent, or Firm* — Morgan, Lewis & Bockius LLP

(57) ABSTRACT

A method and measuring device for determining the usage rate of a breaking hammer, and to a rock breaking device. The measuring device comprises a sensor for measuring a physical phenomenon caused by the operation of the percussion device. The measuring results are processed, and they are used to determine the start and end times of the operation of the percussion device. By means of a timing device, it is possible to determine the duration of an impact cycle which is added to a time counter. The durations of impact cycles added cumulatively to the time counter indicate the total percussion time of the breaking hammer. Impact pauses between impact cycles are also monitored, and pauses shorter than a predefined time limit are taken into account as part of the usage rate.

18 Claims, 6 Drawing Sheets

(56) References Cited

U.S. PATENT DOCUMENTS

| | | | | |
|---|---|---|---|---|
| 6,510,902 | B1 | 1/2003 | Prokop et al. | |
| 6,737,981 | B2 | 5/2004 | Hagemeister et al. | |
| 7,156,188 | B2 * | 1/2007 | Bermingham et al. | 173/2 |
| 2003/0023325 | A1 | 1/2003 | Adachi et al. | |
| 2003/0110667 | A1 | 6/2003 | Adachi et al. | |

* cited by examiner

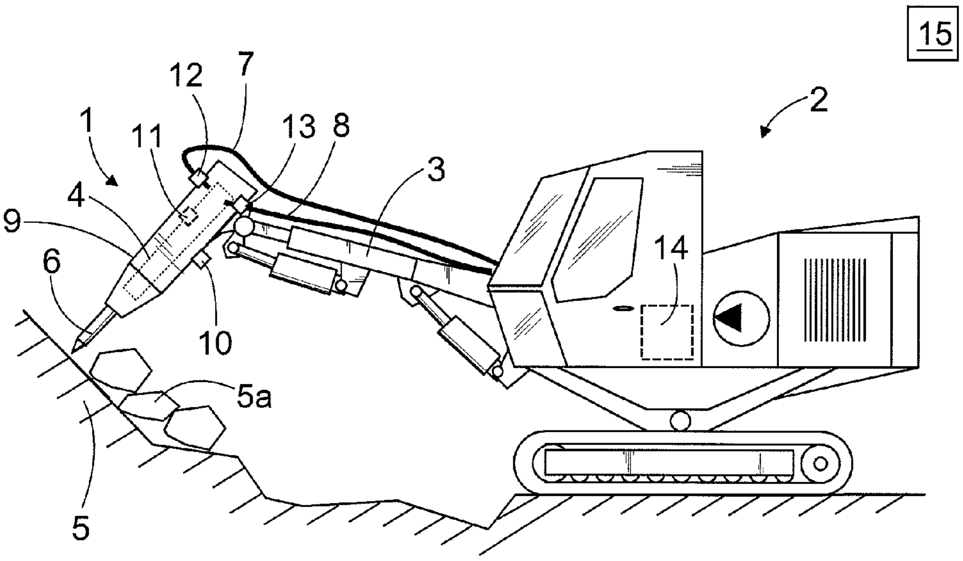

FIG. 1

Set stop time $t_{stop2}$ 30 s

| | | | |
|---|---|---|---|
| 2 s | Percussion operation | Impact time | |
| 3 s | No percussion operation | Pause time | $t_{pause} < t_{stop2}$ |
| 5 s | Percussion operation | Impact time | |
| 2 s | No percussion operation | Pause time | $t_{pause} < t_{stop2}$ |
| 1 s | Percussion operation | Impact time | |
| 46 s | No percussion operation | Stop time | $t_{pause} > t_{stop2}$ |
| 2 s | Percussion operation | Impact time | |
| 3 s | No percussion operation | Pause time | $t_{pause} < t_{stop2}$ |
| 10 s | Percussion operation | Impact time | |
| 74 s | | | |

Total impact time 20 s
Total pause time 8 s
Total use time 28 s
Stop time total 46 s
Monitoring cycle duration 74 s
Number of impact pauses 3 kpl
Number of impact cycles 5 kpl

FIG. 2

METHOD FOR DETERMINING USAGE RATE OF BREAKING HAMMER, BREAKING HAMMER, AND MEASURING DEVICE

RELATED APPLICATIONS

The present application is a U.S. National Phase Application of International Application No. PCT/FI2010/051061 (filed 20 Dec. 2010) which claims priority to Finnish Application No. 20096374 (filed 21 Dec. 2009).

BACKGROUND OF THE INVENTION

The invention relates to a method for determining the usage rate of a breaking hammer. A breaking hammer comprises a percussion device, as a result of the work cycle of which impact pulses are generated that may be transmitted to the material being processed by means of a tool so as to break the material. The operation of the percussion device causes physical phenomena that are measured with a sensor. By analysing the measuring results, it is possible to identify the work cycle of the percussion device and, on the basis thereof, define a quantity representing the usage rate of the percussion device. The usage rate determined during the operation of the percussion device is added cumulatively into a counter and may be expressed to the operator of the breaking hammer.

The invention further relates to a breaking hammer, the usage rate of which is determined by means of a measuring device. The invention also relates to a measuring device, with which the usage rate of the breaking hammer may be determined. The field of the invention is described in more detail in the preambles of the independent claims of the patent application.

Breaking hammers are used to break hard materials, such as rock, concrete, and the like. A breaking hammer comprises a percussion device for generating impact pulses to a breaking tool connectable to the breaking hammer. The breaking hammer is usually connected as an auxiliary device to a basic machine that may be an excavator, for example. The basic machine is typically equipped with an operating hour meter for monitoring the expiry of service cycles, among other things. However, determining the usage rate of the breaking hammer on the basis of the operating hours of the basic machine is very imprecise, because the breaking hammer is used only part of the time in comparison with the operating hours of the basic machine. Some of the operating hours of the basic machine are namely used in transferring the basic machine and positioning the breaking hammer by means of a boom. In addition, the basic machine, such as an excavator, may be used with other auxiliary devices, such as a bucket.

Thus, measuring devices have been developed to determine the usage rate of the breaking hammer independent of the basic machine. Publications U.S. Pat. No. 6,510,902 B1, U.S. Pat. No. 6,737,981 B2, and U.S. Pat. No. 6,170,317 B1 disclose arrangements for identifying the impacts of a breaking hammer by means of different sensors. In the publications, the servicing need of the breaking hammer is determined on the basis of the number of impacts. However, it has been noted that, in practice, it is difficult to reliably measure the number of all individual impacts. It has been noted that the obtained measuring results may be quite imprecise. In result, the services of breaking hammers are performed either too late or too soon. Further, publication GB 2 442 629 A describes measuring the pressure of the pump operating the breaking hammer and determining the operating time, that is, impact time, of the percussion device on the basis of the pressure. Publication US 2003/0 110 667 A1 describes furnishing the pressure channel of the breaking hammer with a pressure switch, with which the operating time of the percussion device is determined. However, loads may be directed to the breaking hammer even when it is not generating impacts. These loads cannot in any way be taken into account in the prior-art solutions. Thus, the above-mentioned arrangements based on measuring the impact rate or time do not provide sufficiently precise information on the load directed to the breaking hammer for the purpose of proactive maintenance, for example.

BRIEF DESCRIPTION OF THE INVENTION

It is an object of this invention to provide a novel and improved method and measuring device for determining the usage rate of a breaking hammer, and further a novel and improved breaking hammer equipped with this type of measuring device.

The method of the invention is characterised by identifying impact pauses between impact cycles and monitoring their duration; and identifying the impact pauses whose duration is shorter than a predefined time limit and taking them into account as part of the usage rate.

The breaking hammer of the invention is characterised in that the measuring device is fastened to the breaking hammer, whereby it is a separate device independent of the basic machine; that the measuring device is also arranged to identify impact pauses between impact cycles and to monitor their duration; and that the measuring device is arranged to identify and take into account the impact pauses whose duration is shorter than a predefined time limit.

The measuring device of the invention is characterised in that a control unit is also arranged to identify impact pauses between impact cycles and to monitor their duration; and that the control unit is arranged to identify and take into account the impact pauses whose duration is shorter than a predefined time limit.

The idea of the invention is that one or more physical phenomena caused by the work cycle of the percussion device are measured and the start and end of the impact cycles of the percussion device are determined on the basis of the measuring results. Further, the duration of each impact cycle is determined on the basis of the start and end times of the impact cycle. The durations of the impact cycles are accumulated in a time counter. Not only the total impact time but also the impact pauses between consecutive impact cycles are identified and their duration monitored. A time limit is defined in advance in a control system, and impact pauses shorter than the time limit are identified and taken into account as part of the usage rate.

An advantage of the invention is that in addition to the impact time, also short impact pauses characteristic of hammer work are taken into account in determining the usage rate. Typically, between impact cycles, that is, during impact pauses, the breaking hammer is used among other things to move broken boulders with the tool, which causes high loads to the breaking hammer. The arrangement of the invention takes into account these relatively short impact pauses, whereby the loads of the breaking device are revealed in more detail. Thus, the services of the breaking hammer can be planned in advance and in more detail. In addition, the operating life of the breaking hammer is better known, as is the future replacement time of components.

The idea of an embodiment is that the durations of impact pauses within a predefined or set time limit are determined and cumulatively summed to obtain a total pause time. The total pause time may be taken into account when loads directed to the breaking hammer and need for servicing are examined. When the total pause time is long, it usually means that a lot of boulder moving has been done with the breaking hammer, so a high amount of load differing from normal percussion operation has been directed to the breaking hammer.

The idea of an embodiment is that the operating time of the breaking hammer is determined during a desired monitoring cycle so that the total impact time and total pause time are summed. The total operating time of the breaking hammer provides an illustrative idea of the condition and maintenance needs of the breaking hammer.

The idea of an embodiment is that clock cycles are counted when the value of the measuring result exceeds a predefined trigger level, and the counting of clock cycles is interrupted after a predefined time, $t_{stop1}$, has lapsed since the trigger level was exceeded without a new exceeding of the trigger level. The time $t_{stop1}$ is clearly longer than the work cycle time of the hammer, but clearly shorter than a typical pause time in hammer work. Further, the last exceeding of the trigger level is determined and the clock cycle following it is defined as the end time of the impact cycle. Finally, the clock cycles between the start and end times of the impact cycle are added to the time counter. The pause time is also determined on the basis of clock cycles. When a predefined time, $t_{stop1}$ has lapsed since the trigger level was exceeded without a new exceeding of the trigger level, the passing time is interpreted as an impact pause, which in turn may be classified as a shorter pause cycle or a longer stop cycle depending on its duration.

The idea of an embodiment is that a time, $t_{stop2}$, which is longer than a typical pause time between impact cycles in hammer work, is set as the time limit for impact pauses.

The idea of an embodiment is that the time limit $t_{stop2}$ of impact pauses is an adjustable parameter. The time limit may be programmed into a control unit, for example, or adjusted in some other manner.

The idea of an embodiment is that the measuring results are examined in relation to clock cycles of a timing device in the control unit.

The idea of an embodiment is that acceleration excitations, such as vibrations, caused by the work cycle of the percussion device are measured with one or more sensors. The sensor may be a piezo-sensor, for instance, and it may be fastened to the body of the percussion device or a housing protecting the percussion device.

The idea of an embodiment is that the breaking hammer is hydraulic. The operation of the percussion device causes pressure pulsation in its pressure system, and by monitoring this, it is possible to find out the start and end times of impact cycles, and on the basis of these, it is possible to determine the impact time of each impact cycle. Further, it is possible to determine an impact pause and its duration on the basis of the end and start times of the pressure pulsation. In addition, a pressure sensor is arranged in the breaking hammer.

The idea of an embodiment is that the measuring device is an independently working device. The measuring device comprises all devices required for measuring, result processing, and result displaying. Further, the measuring device comprises its own body or protective cover and fastening means for fastening it to the breaking hammer. Yet further, the measuring device comprises a storage for the necessary operating power, the storage being an accumulator, battery, or the like. This type of measuring device is a separate device completely independent of the basic machine.

The idea of an embodiment is that the independent measuring device can easily be arranged to any breaking hammer, and it may easily be detached and re-fastened.

The idea of an embodiment is that the independent measuring device is fastened permanently to the breaking hammer, whereby it is a breaking hammer-specific device that is always with one and the same breaking hammer.

The idea of an embodiment is that the measuring device compares the time accumulated in the time counter with at least one predefined limit value and indicates when the limit value is exceeded. The measuring device may compare the accumulated total usage time, impact time, or pause time with the limit value set for each of these.

The idea of an embodiment is that the measuring device comprises at least one indicator for indicating usage time to the operator. The indicator may indicate to the user visually or with a sound the usage time or the fact that a pre-set alarm limit has been exceeded. The measuring device may have one or more LEDs to show the usage time, or the LED may be arranged to indicate the size of the usage time by blinking.

The idea of an embodiment is that the measuring device comprises one or more data communications units, with which a data transfer connection may be established between the measuring device and an external control unit or reading device. At its simplest, the data communications unit may comprise connecting means, to which a data transfer cable may be connected for wired data transfer. Alternatively, the data communications unit may comprise means for wireless data transfer, in which case the means may include a transmitter and possibly also a receiver. The measuring device may be arranged to transfer data on the usage time either continuously or after a request has been transmitted to the control unit for supplying the data.

The idea of an embodiment is that one or more sensors measure the movement of the percussion element of the percussion device or the valve controlling it.

The idea of an embodiment is that one or more sensors measure the sound caused by the work cycle of the percussion device.

The idea of an embodiment is that one or more sensors measure the stress caused by the work cycle of the percussion device in the breaking hammer structure.

The idea of an embodiment is that the operation of the breaking hammer is monitored during a predefined monitoring time and several impact cycles are identified during it. By monitoring the durations of the impact cycles, additional information on the use of the breaking hammer and its suitability for said use and work site is obtained. The durations of the impact cycles may also be used to determine the need for maintenance.

BRIEF DESCRIPTION OF THE FIGURES

Some embodiments of the invention will be described in more detail in the attached drawings, in which FIG. 1 is a schematic view of a breaking hammer arranged as an auxiliary device to an excavator, FIG. 2 is a schematic view of some measuring results received from a measuring device in the breaking hammer and related to the usage rate of the hammer during a monitoring period.

In the figures, some embodiments of the invention are shown simplified for the sake of clarity. Similar parts are marked with the same reference numbers in the figures.

DETAILED DESCRIPTION OF SOME EMBODIMENTS OF THE INVENTION

Figure 3:
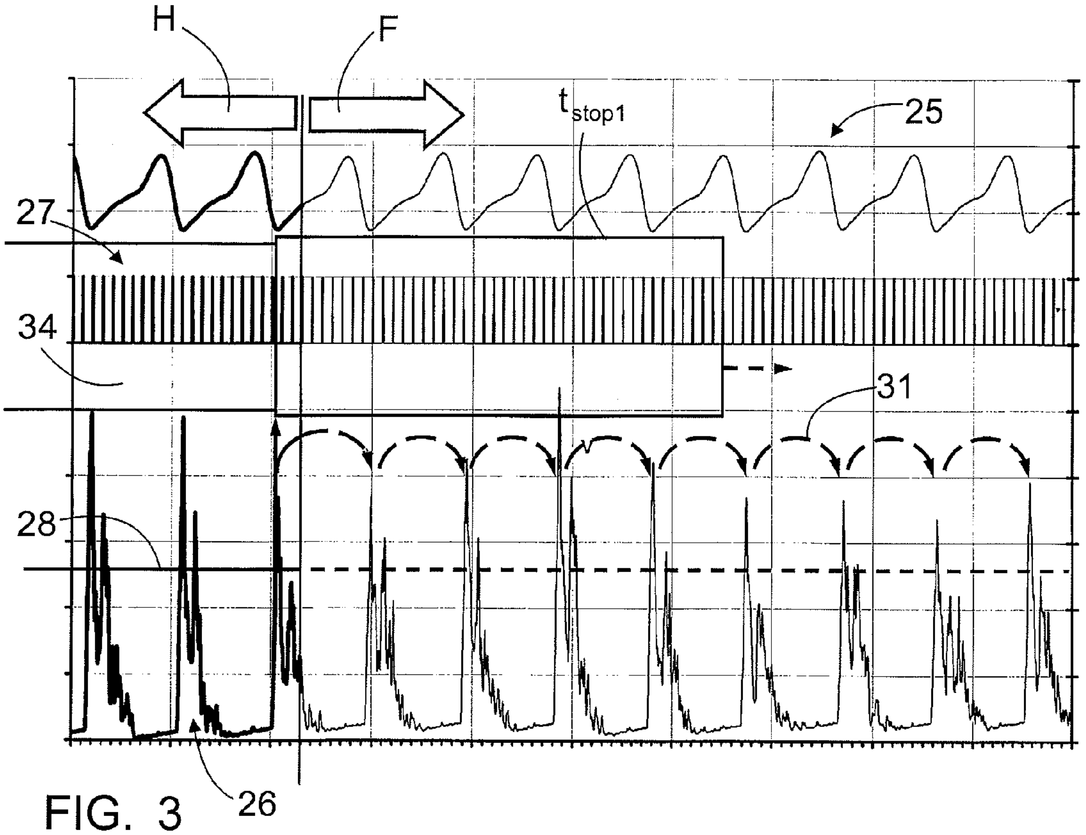
FIGS. 3 and 4 are schematic and graphical representations of the principle of calculating usage time when the impact cycle is identified by an acceleration sensor.

FIG. 1 shows a breaking hammer 1 arranged on the free end of a boom 3 in a working machine 2, such as an excavator. Alternatively, the boom 3 may be arranged on any movable carriage- or on a fixed platform of a crushing apparatus. The breaking hammer 1 comprises a percussion device 4 for generating impact pulses. The breaking hammer 1 may be pressed by means of the boom 3 against material 5 to be broken and impacts may be simultaneously generated with the percussion device 4 to a tool 6 connected to the breaking hammer 1, which transmits the impact pulses to the material 5 to be broken. The percussion device 4 may be hydraulic, whereby it may be connected to the hydraulic system of the working machine 2 through at least one supply channel 7 and at least one discharge channel 8. The impact pulses may be generated in the percussion device 4 by means of a percussion element that may be moved back and forth in the impact direction and return direction under the influence of hydraulic fluid. Further, the breaking hammer 1 may comprise a protective casing 9, inside which the percussion device 4 may be arranged. The breaking hammer 1 is typically used not only to break actual rock, but also to move boulders 5*a* and the like to be broken and those already broken at the work site. The operator then places the tool 6 or casing 9 against the boulder and by moving the boom 3 moves the boulder. High transverse loads are then directed to the tool 6 and the structure of the breaking hammer and strain the bearings and protective casing of the hammer, for example. Further, more loads than is usual are directed to the breaking hammer, if there are a lot of especially short impact cycles. It has been found that a lot of short impact cycles occur, when the used breaking hammer 1 is too powerful for the work. The impact pulse provided by the breaking hammer 1 then breaks the rock so fast that the impact cycle remains very short and the rock breaks under the tool 6 so quickly that the operator cannot prepare for it. In such cases, the bottom part of the protective casing 9 of the breaking hammer often hits the object 5 being broken. Repeated usage of this type may cause the breaking hammer to prematurely wear and fail. In addition, short impact cycles may contain a lot of "empty" impacts, when the material being broken breaks suddenly and the resisting force in front of the tool disappears. The structure of the percussion device then has to receive the percussion forces through the retaining mechanism of the tool. These empty impacts strain the percussion device considerably more than normal percussion operation.

The breaking hammer 1 may be equipped with one or more measuring devices 10 that may comprise one or more sensors for measuring physical phenomena caused by the work cycle of the percussion device 4, such as accelerations, pressure changes, sound, stresses or the like. To the body of the percussion device 4, an acceleration sensor 11, such as a piezo sensor, may be fastened for measuring the accelerations and vibration caused by the work cycle of the percussion device 4. Alternatively, the acceleration sensor 11 may be fastened to the protective casing 9. Further, there may be a first pressure sensor 12 at the supply channel 7 and a second pressure sensor 13 at the discharge channel 8 to measure pressure pulsation caused by the operation of the percussion device 4 in the hydraulic circuit of percussion device. The pressure sensors 12, 13 are always positioned in the breaking hammer 1 and not in connection with pumps or elsewhere in the working machine 2. Measuring results received from the sensors 11, 12, 13 are transmitted to the control unit of the measuring device 10, which identifies the work cycle of the percussion device 4 and the duration of the impact cycle on the basis of the measuring results. The measuring device 10 may be arranged in the breaking hammer 1 in such a manner that it is visible to the operator so that the usage time may be indicated to the operator visually. Alternatively, information may be transmitted from the measuring device 10 to the control unit 14 of the working machine 2 or to some other control unit or reading device 15 external to the breaking hammer 1.

FIG. 2 shows measuring results obtained by monitoring the use of the breaking hammer 1 during a monitoring period of selected duration. By means of the measuring device 10 mounted in the breaking hammer 1, it is possible to identify the start and end of the operation of the percussion device, whereby impact cycles, that is, the time the percussion device is working, are obtained. In addition, by monitoring the operation of the percussion device, it is possible to detect the moments between consecutive impact cycles when the percussion device is not in operation. Even though the percussion device is stopped during the time between impact cycles, it may still be used in tasks where loads are directed to it. These loads directed to the breaking hammer between impact cycles can now be taken into account. The times, when the breaking hammer is completely stopped due to transfer time of the working machine, operator break, maintenance or other reasons, are not relevant to the usage rate of the breaking hammer. No loads are then directed to the breaking hammer, which should be observed when evaluating the maintenance need, service life or usage of the breaking hammer. It is possible to set into the measuring device 10 a time $t_{stop2}$, with which to separate the impact pauses, which are of interest to the usage rate, from the stop time of the breaking hammer. When the operation of the percussion device is stopped for a time longer than $t_{stop2}$, it usually means that a transfer run or other interruption takes place in the breaking operation.

FIG. 2 shows the total impact time that is obtained by summing the durations of impact cycles preformed during one monitoring period. The total pause time is obtained by summing the interruptions in breaking hammer operation between impact cycles, the durations of which are shorter than the set time $t_{stop2}$. The total usage time of the breaking hammer is obtained by summing the total impact time and total pause time. The monitoring period has also had one longer stop cycle, the duration of which can be ignored in the calculation of the usage time. The control unit of the measuring device can calculate not only the above-mentioned parameters, but also other interesting parameters for the use of the breaking hammer. For instance, it is possible to define the ratio of total impact time to the total usage time, or correspondingly the ratio of total pause time to the total usage time. It is possible to set or program into the control unit of the measuring device various strategies, with which the measuring unit monitors the operation of the breaking device, analyzes measuring results and observations, and alerts or informs the operator.

Figure 4:
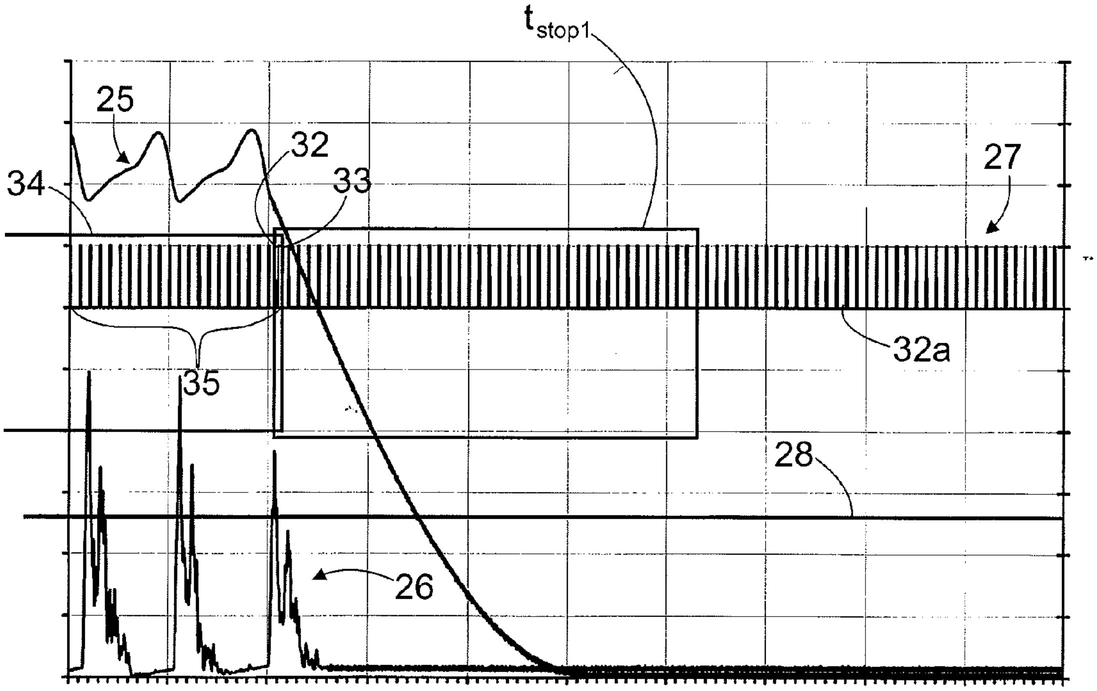
Figure 5:
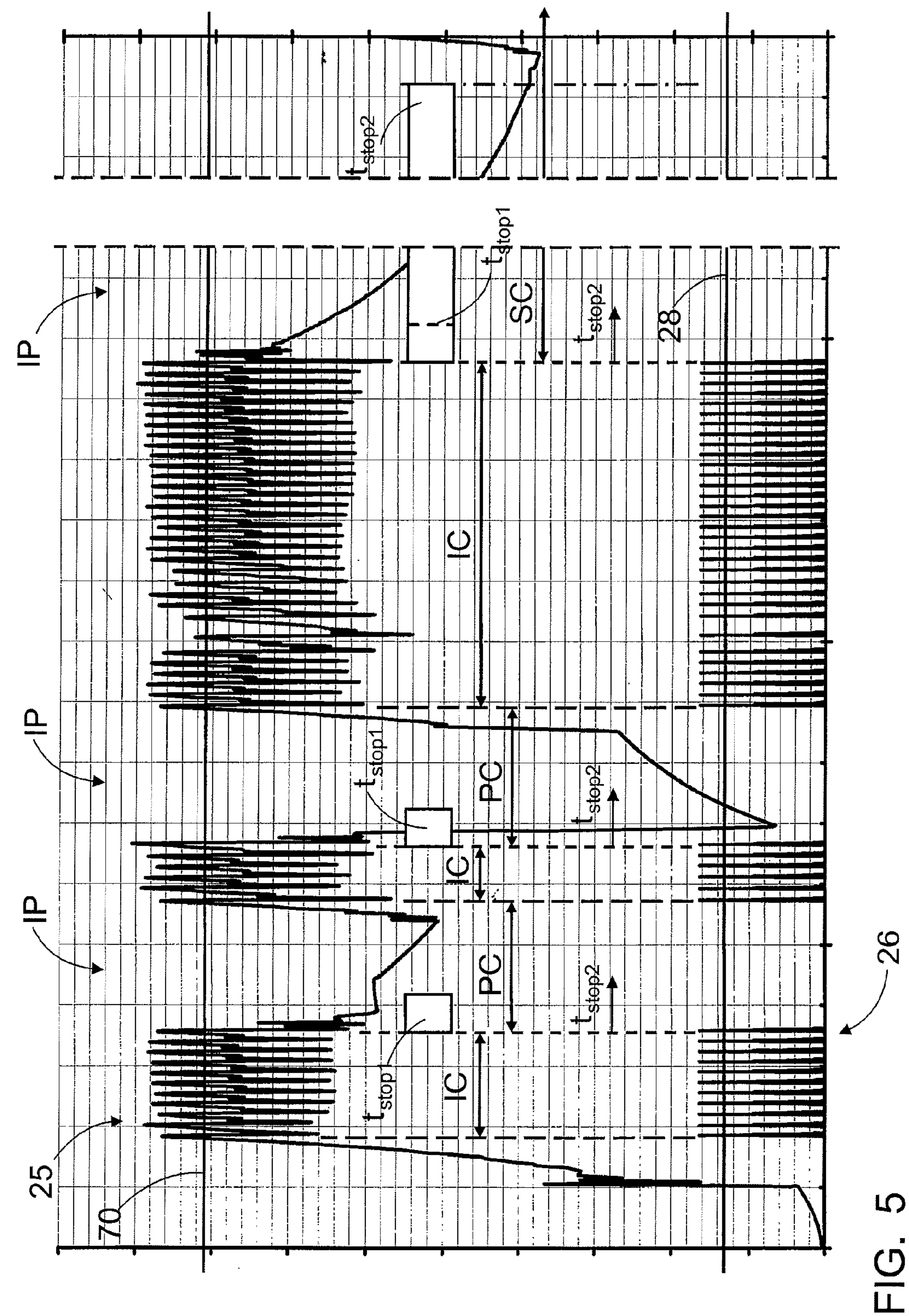
FIG. 5 is a schematic and graphical representation of stopping the counting of impact time and identifying pause and stop cycles.

In FIGS. 3 to 6, the horizontal axis presents time [s], the left vertical axis presents the Piezo sensor value [volt], and the right vertical axis presents pressure [bar]. In addition, in FIG. 3, the marking H refers to past time and F to future time. In FIG. 5, the descriptor is cut at the right edge so that phenomena of different durations can be shown in the same descriptor.

FIG. 3 illustrates the measurement of impact time on the basis of measuring accelerations caused by the operation of the percussion device. FIG. 3 shows in the same figure both a pressure pulsation curve 25 and acceleration curve 26 obtained from the acceleration sensor. The control unit of the measuring device further contains a timing device, the operation of which is shown as a pulse string 27 in FIG. 3. The control unit may be a processor with a system clock running at a 1 to 10 millisecond clock cycle $t_{tick}$ that is illustrated by the distance 71 between the ascending edges of the rectangular pulses 70 in FIG. 6. The clock cycle $t_{tick}$ of the system clock may be defined by means of a crystal or oscillator. FIG. 3 shows on the basis of the pressure pulsation curve 25 and acceleration curve 26 that the percussion device is working and generating a cycle of impacts. The work cycle of the percussion device is also clearly seen from the curves 25 and 26. An acceleration limit value, that is, trigger level 28, can be set in advance into the control unit of the measuring device, and accelerations exceeding this value trigger the identification of an impact cycle. When the control unit identifies an acceleration exceeding the trigger level 28, it construes that the percussion device is working and starts the counting of clock cycles to determine the impact time of the impact cycle. The clock cycles are counted until the stopping of the percussion device is identified.

The end of the operation of the percussion device is detected from the fact that an acceleration exceeding the trigger level 28 is no longer detected. To improve measuring precision, the end time of an impact cycle needs to be defined precisely. Thus, a stop time $t_{stop1}$, the duration of which is always longer than the duration of the work cycle of the percussion device, may be defined in the control unit. Typically, the duration of the work cycle of the percussion device is between 20 and 200 ms, the impact frequency then being 5 to 50 Hz. Depending on the percussion device, the impact frequency may naturally also be higher. When the control unit identifies vibration exceeding the trigger level 28, it begins counting the stop time $t_{stop1}$ from the start time of the triggering. If a new vibration exceeding the trigger level 28 is identified before the stop time $t_{stop1}$ has elapsed, the counting of the impact time is continued uninterrupted and the counting of the stop time $t_{stop1}$ is re-started from the start time of the new triggering. Transferring the stop time $t_{stop1}$ to the start time of the next triggering is illustrated in FIG. 3 by arrows 31.

FIG. 4 shows by examining the pressure curve 25 and acceleration curve 26, the three last work cycles of an impact cycle, after which the percussion device has been stopped. The counting of the stop time $t_{stop1}$ was begun at time instant 32, when the latest acceleration exceeding the trigger level 28 was identified. When a new acceleration exceeding the trigger level 28 is not identified during the stop time $t_{stop1}$, the control unit interprets the impact cycle as ended. After this, the control unit defines the clock cycle 33 following the latest trigger time 32 and adds the clock cycles 35 accumulated up till then into the time counter 34. Thanks to this arrangement, the end time of the impact cycle may be defined at an accuracy of one clock cycle of the timing device. From the end of the impact cycle, an impact pause begins that according its duration is determined either as a pause cycle or stop cycle.

When examining the use of a breaking hammer, a special object of interest is the so-called hammer work time that consists of the durations of impact cycles and pause cycles within the examination period. The rest of the time consists of stop cycles and is, thus, stop time.

FIG. 5 illustrates the identification of the end of the impact cycle IC and the start of the impact pause IP by examining the pressure curve 25 and acceleration curve 26. FIG. 5 also illustrates the division of the impact pause IP into a shorter duration pause cycle PC and longer duration stop cycle SC. When a new impact is not detected during the first stop time $t_{stop1}$, the impact cycle IC is considered to have ended at the clock cycle following the last impact. The impact pause IP begins from the same time instant. When the next acceleration exceeding the trigger level 28 is detected, a new impact cycle IC begins. Further the figure shows the second stop time $t_{stop2}$, the counting of which begins at the same time as the counting of the first stop time $t_{stop1}$. If a new impact is not detected during the second stop time $t_{stop2}$, the impact pause is interpreted as a stop cycle SC. If an impact is detected before the pre-set second stop time $t_{stop2}$ has elapsed, the impact pause IP is interpreted as a pause cycle PC. It should be noted that the stop times may be counted in one and the same time counter or alternatively two or more time counters may be used.

FIG. 5 shows the vibration trigger level 28 and pressure signal trigger level 70. The identification of impact cycles IC and impact pauses IP may take place by monitoring either vibration or pressure or both.

Figure 6:
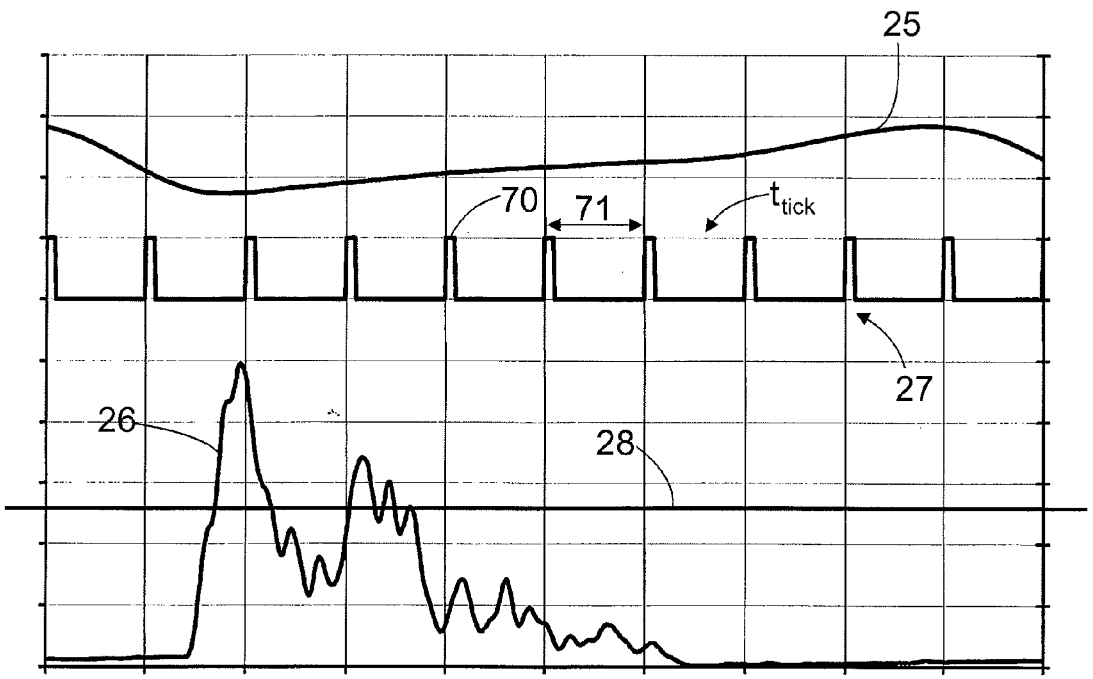
FIG. 6 is a schematic and graphical representation of the concepts used in FIGS. 3 to 5.

FIG. 6 presents for the sake of clarity some concepts shown in FIGS. 3 to 5.

Figure 7:
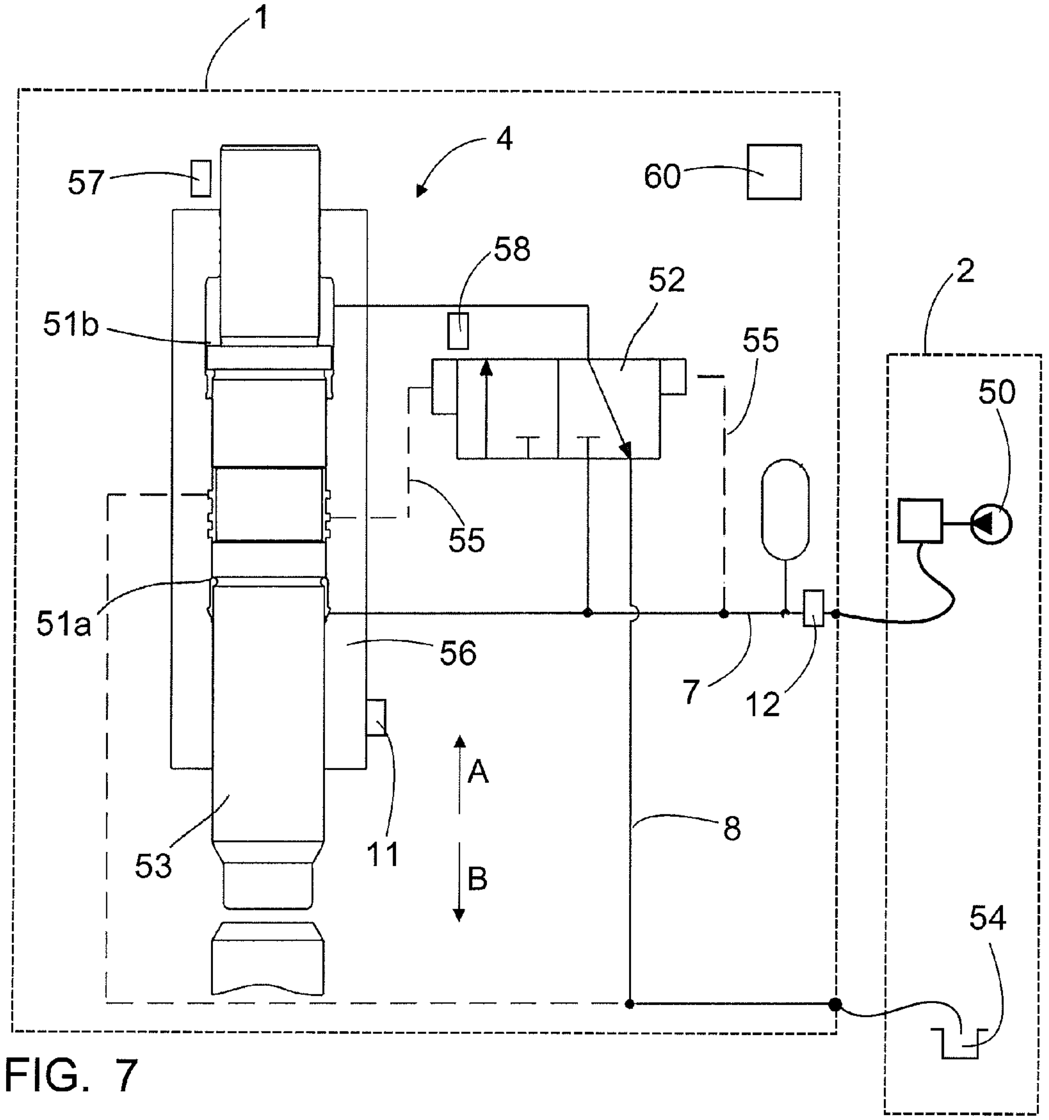
FIG. 7 is a schematic view of a hydraulic circuit for driving the percussion device and some ways of identifying the work cycle, impact cycles and impact pauses of the percussion device.

FIG. 7 shows a hydraulic system for driving the percussion device 4 of the breaking hammer. Hydraulic pressure, which is led through tubes or corresponding channels to the breaking hammer 1 located in the boom, is generated with a pump 50 located in the working machine 2. The breaking hammer 1 has a supply channel 7 that directs the hydraulic fluid into a first working pressure space 51*a* and second working pressure space 51*b* of the percussion device 4. By means of a valve 52, it is possible to act on the pressure in the second working pressure space 51*b* so as to provide the movement of a percussion element 53 in the percussion direction B. In the situation of the figure, the valve 52 guides the pressure medium from the second working pressure space 51*b* to a discharge line 8 and on to a tank 54. The pressure acting in the first working pressure space 51*a* then moves the percussion element 53 in the return direction A. The movement of the valve 52 is controlled by the pressures acting on control pressure channels 55. The valve 52 and percussion element 53 continue their reciprocating movement as long as pressure medium is supplied to the supply channel 7. An acceleration sensor 11 or stress-measuring sensor may be arranged directly to the body 56 of the percussion device 4 or to the protective casing (not shown) arranged around it. Alternatively, the pressure in the supply channel 7 may be measured by means of a pressure sensor 12 arranged in the breaking hammer 1. Measuring results obtained from the sensors 11 and 12 may be applied in the above-mentioned ways to trigger the start or end of impact cycle and pause cycle measurement. It is also possible to measure the movement of the percussion element 53 by means of a first motion sensor 57 and the movement of the valve 52 by means of a second motion sensor 58. On the basis of the measurement data received from the motion sensors 57 and 58, the percussion device 4 can be identified as working. It is then also possible to identify the start time of the impact cycle for the purpose of calculating the impact time. Further, if no identification data is received from the sensors 57 and 58, the impact cycle can be interpreted as having ended. It is then possible to apply to the interruption of the impact cycle counting and to the counting of the pause cycle a corresponding arrangement as described in connection with FIGS. 3, 4, 5, and 6.

Figure 8:
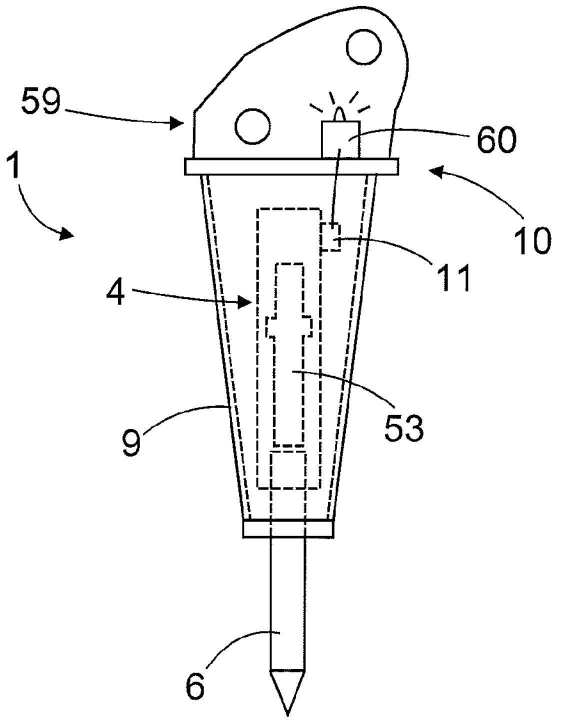
FIG. 8 is a schematic representation of a breaking hammer and a measuring device connected thereto for determining times related to usage.

FIG. 8 shows in a highly simplified manner the breaking hammer 1 and the measuring device 10 connected thereto. The measuring device 10 may be an independent device fastened to the protective casing 9 or fastening piece 59 of the breaking hammer. The independent measuring device 10 is in no way dependent on the working machine. The sensor 11 of the measuring device 10 may be fastened to the body 56 of the percussion device 4, and the measuring results may be transmitted from the sensor 11 to a control unit 60 over wire or wirelessly.

Figure 9:
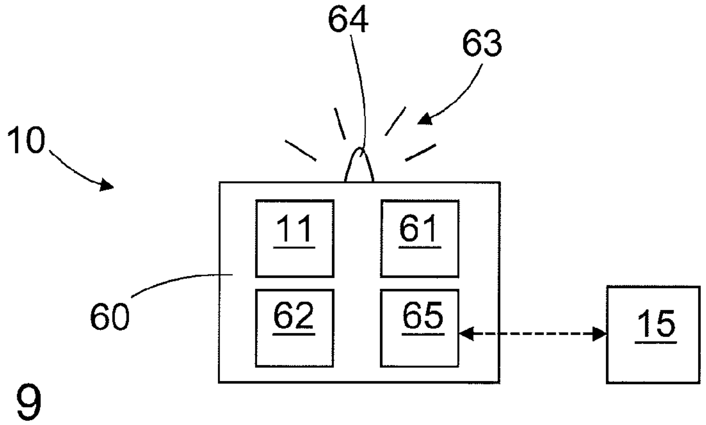
FIG. 9 is a schematic view of a measuring device of the invention.

FIG. 9 shows a measuring device 10, in which the sensor 11 is integrated as part of the control unit 60. The control unit 60 also has a timing device 61 and time counter 62. Further, the control unit 60 may have a detection unit 63 comprising one or more LEDs 64 for indicating usage rate. The control unit 60 may also comprise a data communications unit 65, by means of which the control unit 60 may exchange information with an external unit 15 over wire or wirelessly.

Figure 10:
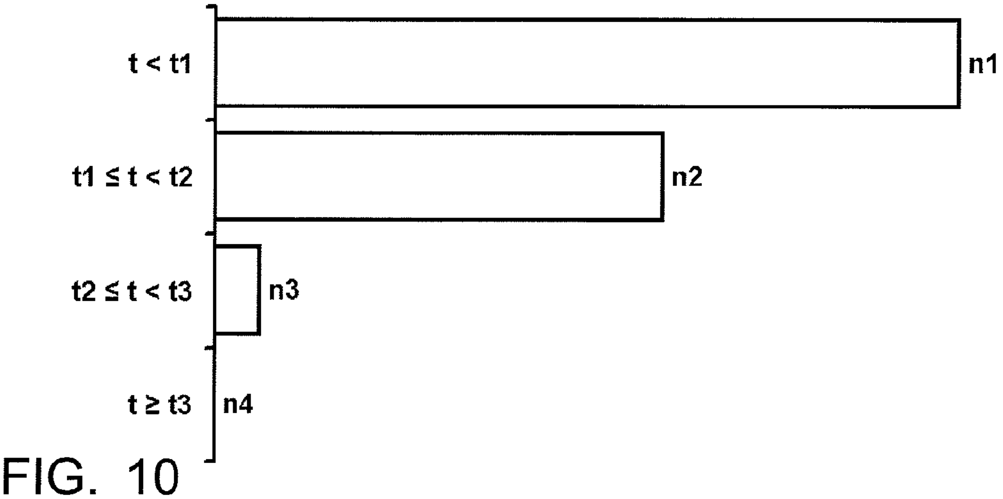
FIG. 10 is a schematic histogram, in which the identified impact cycles are grouped according to their duration.

FIG. 10 illustrates the processing of impact cycles on the basis of durations. The measurement of impact cycle durations and the obtained measuring results can namely also be utilised in other ways than presented above. The operation of the percussion device may be monitored over a predefined monitoring time, during which several impact cycles are identified and the duration of each individual impact cycle is obtained. The impact cycles can also be divided on the basis of their durations. The grounds for the division may be as follows, for instance: duration less than $t_1$ seconds; duration at least $t_1$ seconds, but less than $t_2$ seconds; duration at least $t_2$ seconds, but less than $t_3$ seconds; and duration at least $t_3$ seconds. With this grouping, valuable additional information is obtained on the use of the breaking hammer, for instance. By analysing this information, it is possible to select a suitable breaking device for each task, and to detect an incorrect working technique of the operator. It is further possible to define the need for maintenance on the basis of the analysed information. If the monitoring period of the device contained several very short or very long impact cycles, the device could be submitted to maintenance prematurely, even if other maintenance criteria were not met yet.

It should be mentioned that it is possible to use as the timing device any electric timing device that is suitable for the purpose, runs on a defined clock cycle and whose clock cycles may be added to an electric time counter. The timing device may be a crystal or oscillator in connection with a processor. Further, the timing device may be an electronic integrated circuit or implemented by program or in some other manner. One timing device may be arranged to count both the impact time and pause time or, alternatively, there may be several timing devices. Similarly, there may be one or more time counters.

The measuring processes and measuring result analyses disclosed in this patent application may be provided by executing a software product in the control unit of the measuring device, the control unit of the rock breaking device, or in some other control unit. The software product may be stored in a memory means, such as a memory stick, memory disc, server, or the like.

In some cases, the features described in this application may be used as such, regardless of other features. On the other hand, the features described in this application may also be combined to provide various combinations as necessary.

The drawings and the related description are only intended to illustrate the idea of the invention. The invention may vary in its details within the scope of the claims.

The invention claimed is:

1. A method for determining the usage rate of a breaking hammer, the breaking hammer comprising a percussion device for generating impact pulses, the method comprising:

measuring by means of at least one sensor at least one physical phenomenon caused by the operation of the percussion device;

transmitting the measuring results obtained from the sensor to at least one control unit that comprises at least one timing device;

identifying in the control unit on the basis of the measuring results the work cycle and impact cycles of the percussion device, and defining by means of the timing device durations for the impact cycles;

summing cumulatively in the counter of the control unit the durations of the impact cycles to obtain the total impact time;

identifying impact pauses between the impact cycles and monitoring their duration; and identifying the impact pauses with a duration shorter than a predefined time limit and taking them into account as part of the usage rate.

2. A method as claimed in claim 1, comprising summing the durations of the impact pauses having a shorter duration than the predefined time limit to define the total pause time.

3. A method as claimed in claim 1, comprising summing the durations of the impact pauses having a shorter duration than the predefined time limit to define the total pause time, and defining the total usage time of the breaking hammer by summing the total impact time and total pause time.

4. A method as claimed in claim 1, comprising:

identifying the start and end times of the impact cycle on the basis of the measuring results;

starting the counting of the duration of the impact pause from the detected end time of the impact cycle;

ending the counting of the duration of the impact pause, when the start time of a new impact cycle is identified; and counting the duration of the impact pause at most until the defined time limit.

5. A method as claimed in claim 1, comprising:

interpreting the impact pauses with a duration exceeding the predefined time limit as stop cycles in the use of the breaking hammer, when substantially no loads are directed to the breaking hammer, and ignoring these stop cycles completely when determining the usage rate of the breaking hammer.

6. A method as claimed in claim 1, comprising:

examining the operation of the percussion device in relation to the clock cycles of the running of the timing device in the control unit;

adding the time cycles cumulatively into the time counter after an at least one first criterion pre-set for the measuring results is met;

interrupting the adding of clock cycles into the time counter, when a second pre-set criterion is met; and continuing the adding of clock cycles into the time counter, when the first pre-set criterion is again met.

7. A method as claimed in claim 1, comprising:
measuring with the acceleration sensor vibrations caused by the operation of the percussion device;
examining the measuring results in relation to the clock cycles of the running of the timing device in the control unit;
counting the clock cycles, when the value of the measuring result exceeds a predefined trigger level;
interrupting the counting of the clock cycles after a predefined stop time has elapsed from the exceeding of the trigger level without a new exceeding of the trigger level;
determining the last exceeding of the trigger level and defining the clock cycle following it as the end time of the impact cycle; and
adding the clock cycles between the start and end times of the impact cycle to the time counter.

8. A method as claimed in claim 1, comprising:
measuring with a pressure sensor positioned in the breaking hammer the pressure of a pressure medium acting in a pressure medium circuit of the percussion device;
detecting pressure pulsation caused by the work cycle of the percussion device during an impact cycle;
determining the start and end times of the impact cycle (IC) on the basis of the pressure pulsation; and
using the start and end times of the impact cycle to define the impact cycle and impact pause.

9. A method as claimed in claim 1, comprising comparing the impact time accumulated into the time counter with at least one predefined impact time limit value, and indicating that the limit value has been exceeded.

10. A method as claimed in claim 1 comprising:
summing the durations of the impact pauses having a shorter duration that the predefined time limit to define the total pause time,
defining the total usage time of the breaking hammer by summing the total impact time and total pause time, and
comparing the usage time accumulated into the time counter with at least one predefined usage time limit value, and indicating that the limit value has been exceeded.

11. A method as claimed in claim 1, comprising comparing the pause time accumulated into the time counter with at least one predefined pause time limit value, and indicating that the limit value has been exceeded.

12. A method as claimed in claim 1, comprising:
monitoring the operation of the breaking hammer during a monitoring time and identifying several impact cycles and the duration of each impact cycle; and
using the distribution of the durations of the impact cycles as one additional criterion in the determination of the usage rate.

13. A breaking hammer comprising:
fastening means for fastening the breaking hammer detachably to a boom of a basic machine;
a percussion device for generating impact pulses;
a tool arranged to receive impact pulses and to transmit them to the material to be broken; and
at least one measuring device for determining the usage rate of the breaking hammer, the measuring device comprising at least one sensor for measuring at least one physical phenomenon caused by the work cycle of the percussion device, at least one control unit for processing the measuring results and determining the usage rate, and further at least one counter, into which the values representing the usage rate are cumulatively added;
the measuring device being also arranged to identify on the basis of the measuring results received from the sensor the starting and ending of an impact cycle of the percussion device, and to calculate the duration of the impact cycle on the basis thereof;
and wherein the measuring device is fastened to the breaking hammer, whereby it is an independent device separate from the basic machine,
the measuring device is also arranged to identify impact pauses between impact cycles and to monitor their duration, and
the measuring device is arranged to identify and take into account the impact pauses with a duration shorter than the predefined time limit.

14. A breaking hammer as claimed in claim 13, wherein a time limit of desired length for impact pauses is settable in the control unit of the measuring device.

15. A breaking hammer as claimed in claim 13, wherein the sensor is an acceleration sensor, and the acceleration sensor is fastened to the body of the percussion device for measuring vibrations caused by the work cycle of the percussion device.

16. A breaking hammer as claimed in claim 13, wherein the sensor is an acceleration sensor arranged to measure vibrations caused by the work cycle of the percussion device, there is at least one protective casing around the percussion device, and the acceleration sensor is fastened to the protective casing.

17. A breaking hammer as claimed in claim 13, wherein the percussion device is hydraulic, the sensor is a pressure sensor arranged to measure pressure pulsation caused by the operation of the percussion device in the pressure medium circuit of the percussion device, and the pressure sensor is arranged in the breaking hammer.

18. A measuring device of the usage rate of a breaking hammer comprising:
at least one sensor with which at least one physical phenomenon caused by the operation of the percussion device belonging to the breaking hammer is measured;
at least one control unit for processing the measuring results received from the sensor and for determining the usage rate;
the control unit comprising at least one timing device and at least one time counter;
the control unit being arranged to identify on the basis of the measuring results the starting and ending of impact cycles of the percussion device and to determine the duration of each impact cycle;
the control unit being arranged to add the durations of the impact cycles cumulatively into the time counter;
the control unit is also arranged to identify impact pauses between impact cycles and to monitor their duration; and
the control unit is arranged to identify and take into account the impact pauses with a duration shorter than the predefined time limit.

* * * * *